United States Patent
Oratti Kalandar et al.

(10) Patent No.: US 10,147,645 B2
(45) Date of Patent: Dec. 4, 2018

(54) WAFER LEVEL CHIP SCALE PACKAGE WITH ENCAPSULANT

(71) Applicant: FREESCALE SEMICONDUCTOR, INC., Austin, TX (US)

(72) Inventors: Navas Khan Oratti Kalandar, Austin, TX (US); Nishant Lakhera, Austin, TX (US); Akhilesh K. Singh, Austin, TX (US)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 14/861,843

(22) Filed: Sep. 22, 2015

(65) Prior Publication Data

US 2017/0084491 A1    Mar. 23, 2017

(51) Int. Cl.
| | |
|---|---|
| *H01L 29/06* | (2006.01) |
| *H01L 29/08* | (2006.01) |
| *H01L 21/78* | (2006.01) |
| *H01L 21/56* | (2006.01) |
| *H01L 21/304* | (2006.01) |
| *H01L 23/31* | (2006.01) |
| *H01L 23/00* | (2006.01) |

(52) U.S. Cl.
CPC .......... *H01L 21/78* (2013.01); *H01L 21/3043* (2013.01); *H01L 21/561* (2013.01); *H01L 23/3114* (2013.01); *H01L 23/3135* (2013.01); *H01L 24/11* (2013.01); *H01L 24/17* (2013.01); *H01L 24/81* (2013.01); *H01L 2224/11334* (2013.01); *H01L 2224/13014* (2013.01); *H01L 2224/13016* (2013.01); *H01L 2224/16225* (2013.01); *H01L 2224/81191* (2013.01)

(58) Field of Classification Search
CPC .......... H01L 2224/97; H01L 2924/181; H01L 21/561; H01L 2224/94; H01L 2224/11; H01L 21/76898; H01L 25/50
See application file for complete search history.

(56) References Cited

U.S. PATENT DOCUMENTS

| | | | | |
|---|---|---|---|---|
| 6,162,702 | A * | 12/2000 | Morcom | H01L 21/02035 257/619 |
| 7,148,125 | B2 * | 12/2006 | Suzuki | H01L 29/0657 438/459 |
| 7,622,328 | B2 * | 11/2009 | Masuda | B28D 5/0029 257/E21.237 |
| 7,674,654 | B2 * | 3/2010 | Brunnbauer | H01L 21/56 438/113 |
| 7,843,042 | B2 | 11/2010 | Kuan et al. | |
| 8,292,690 | B2 * | 10/2012 | Seddon | H01L 21/02035 451/5 |

(Continued)

*Primary Examiner* — Ismail Muse

(57) ABSTRACT

A method of processing a semiconductor wafer includes forming a plurality of die in the semiconductor wafer. The semiconductor wafer has a first brittleness. The top surface the semiconductor wafer undergoes grinding to leave an inner planar surface and a rim, wherein the rim extends above the inner planar surface and around a perimeter of the grinded semiconductor wafer. The first encapsulant material is formed over the inner planar surface and contained within the rim to form a composite semiconductor wafer that has a second brittleness less than the first brittleness. The composite semiconductor wafer is singulated into the plurality of die in which each die of the plurality of die is a composite structure die.

17 Claims, 5 Drawing Sheets

(56) References Cited

U.S. PATENT DOCUMENTS

| | | | | |
|---|---|---|---|---|
| 8,785,297 B2* | 7/2014 | Feron | ............... | H01L 21/561 |
| | | | | 438/459 |
| 9,627,287 B2* | 4/2017 | Engelhardt | ......... | H01L 23/3185 |
| 2001/0016400 A1 | 8/2001 | Lee | | |
| 2002/0013015 A1* | 1/2002 | Kado | ............... | H01L 23/49838 |
| | | | | 438/107 |
| 2006/0292826 A1* | 12/2006 | Kajiyama | ........... | H01L 21/3043 |
| | | | | 438/459 |
| 2007/0020887 A1* | 1/2007 | Sekiya | ............... | B24B 7/228 |
| | | | | 438/459 |
| 2007/0077731 A1* | 4/2007 | Masuda | ............... | B28D 5/0029 |
| | | | | 438/458 |
| 2008/0064187 A1* | 3/2008 | Brown | ............... | B23K 26/03 |
| | | | | 438/464 |
| 2008/0169547 A1* | 7/2008 | Baek | ............... | H05K 1/0271 |
| | | | | 257/686 |
| 2008/0251510 A1* | 10/2008 | Park | ............... | B82Y 30/00 |
| | | | | 219/528 |
| 2009/0011543 A1 | 1/2009 | Karta et al. | | |
| 2010/0009519 A1* | 1/2010 | Seddon | ............... | H01L 21/6836 |
| | | | | 438/464 |
| 2010/0013087 A1* | 1/2010 | England | ............... | H01L 24/19 |
| | | | | 257/700 |
| 2010/0155922 A1* | 6/2010 | Pagaila | ............... | H01L 21/568 |
| | | | | 257/686 |
| 2011/0248409 A1* | 10/2011 | Yang | ............... | H01L 21/76898 |
| | | | | 257/774 |
| 2011/0272800 A1* | 11/2011 | Chino | ............... | H01L 21/561 |
| | | | | 257/737 |
| 2012/0024456 A1* | 2/2012 | Lin | ............... | H01L 22/26 |
| | | | | 156/64 |
| 2012/0064696 A1* | 3/2012 | Hirosawa | ............... | H01L 21/304 |
| | | | | 438/462 |
| 2012/0070959 A1* | 3/2012 | Wood | ............... | H01L 21/3043 |
| | | | | 438/460 |
| 2012/0104580 A1* | 5/2012 | Feng | ............... | H01L 21/561 |
| | | | | 257/673 |
| 2012/0104623 A1* | 5/2012 | Pagaila | ............... | H01L 23/13 |
| | | | | 257/774 |
| 2012/0264257 A1* | 10/2012 | Lee | ............... | H01L 24/50 |
| | | | | 438/113 |
| 2013/0001766 A1* | 1/2013 | Takyu | ............... | H01L 21/304 |
| | | | | 257/734 |
| 2013/0026605 A1 | 1/2013 | Ng | | |
| 2013/0196484 A1* | 8/2013 | Moriceau | ............... | H01L 21/762 |
| | | | | 438/458 |
| 2013/0217185 A1* | 8/2013 | Wisotzki | ............... | H01L 21/304 |
| | | | | 438/113 |
| 2013/0237032 A1* | 9/2013 | Zhang | ............... | H01L 21/2007 |
| | | | | 438/459 |
| 2013/0295720 A1* | 11/2013 | Fuergut | ............... | H01L 23/3107 |
| | | | | 438/107 |
| 2014/0110826 A1 | 4/2014 | Buenning et al. | | |
| 2014/0183761 A1 | 7/2014 | Lin et al. | | |
| 2014/0327003 A1* | 11/2014 | Fuergut | ............... | H01L 21/67069 |
| | | | | 257/48 |
| 2015/0097294 A1* | 4/2015 | Yeduru | ............... | H01L 21/4814 |
| | | | | 257/773 |
| 2015/0108666 A1* | 4/2015 | Engelhardt | ......... | H01L 23/3185 |
| | | | | 257/787 |
| 2015/0214077 A1* | 7/2015 | Tsai | ............... | H01L 21/78 |
| | | | | 257/737 |
| 2015/0332909 A1* | 11/2015 | Suzuki | ............... | B24B 1/00 |
| | | | | 438/691 |
| 2015/0332952 A1* | 11/2015 | Priewasser | ......... | H01L 21/6835 |
| | | | | 438/464 |

* cited by examiner

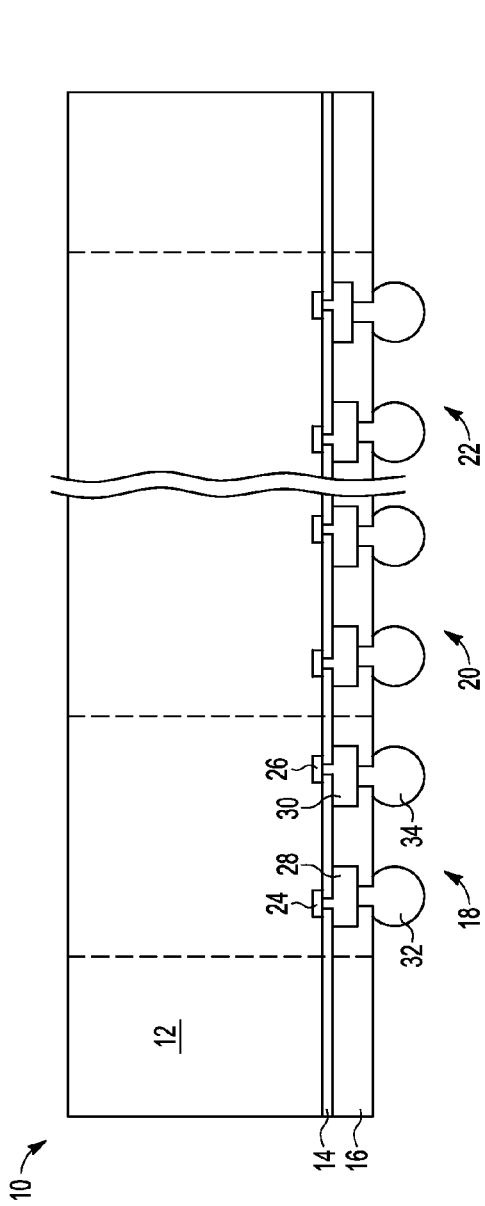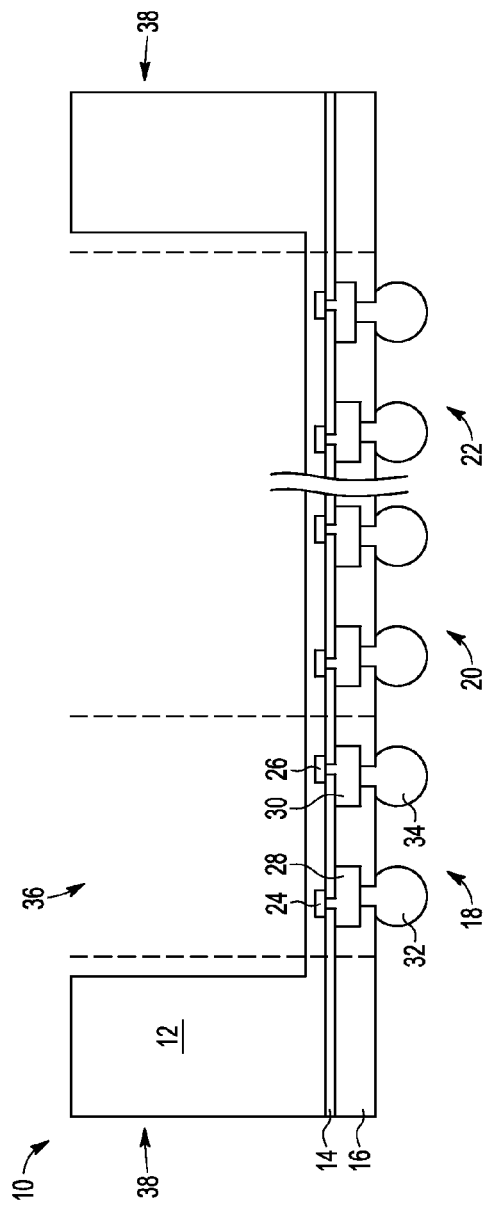

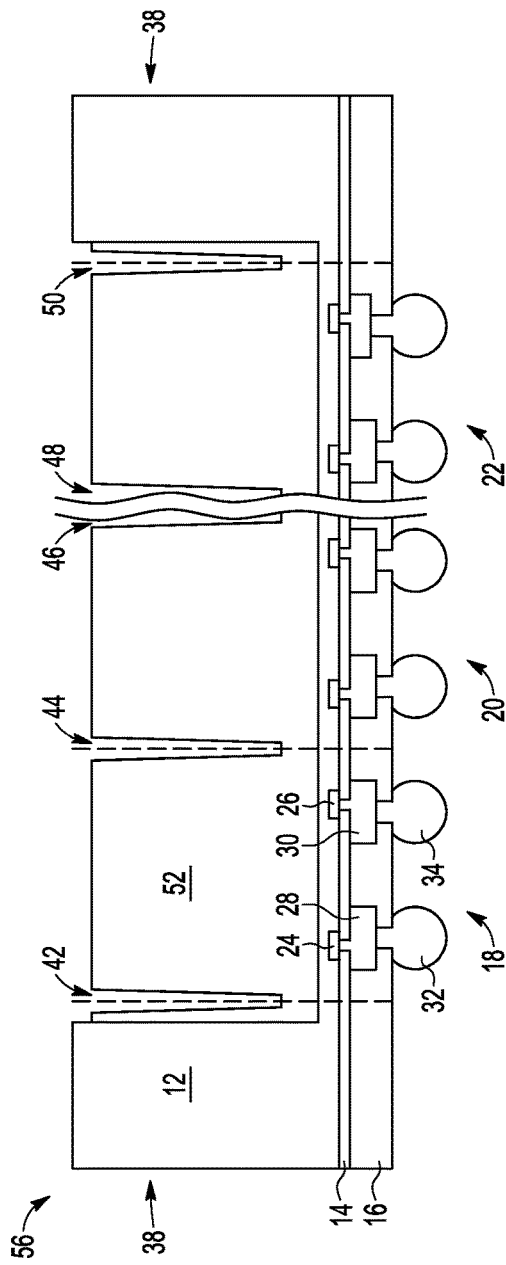
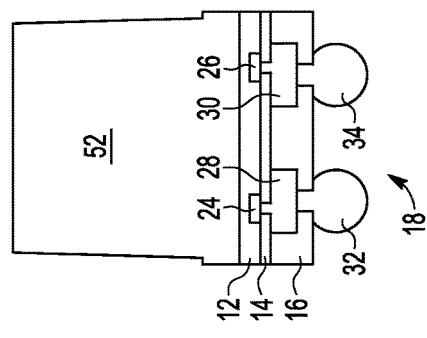
FIG. 5
FIG. 6

WAFER LEVEL CHIP SCALE PACKAGE WITH ENCAPSULANT

BACKGROUND

Field

This disclosure relates generally to semiconductor processing, and more specifically, to wafer level chip scale packaging with an encapsulant.

Related Art

Chip scale packaging (CSP) allows for packaging on a chip size scale, typically within 1.2 times the die size. Wafer-level CSP (WLCSP) has allowed for further reduction in size. In WLCSP, interconnects, such as solder balls, are formed on the active surface of the die while the die are still part of a wafer, prior to singulation. This allows for multiple packages to be manufactured at the same time, and also allows the package to be the same size as the die. However, after singulation, the die are brittle because they are not covered with any encapsulant, making them susceptible to breakage during final test and during customer board mounting due to exposed silicon. Therefore, a need exists for WLCSP with improved robustness.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

FIGS. 1-4 illustrate a semiconductor structure at various stages in processing, in accordance with one embodiment of the present invention.

FIGS. 5-7 illustrate a semiconductor structure at various stages in processing, in accordance with one embodiment of the present invention.

DETAILED DESCRIPTION

Figure 3:
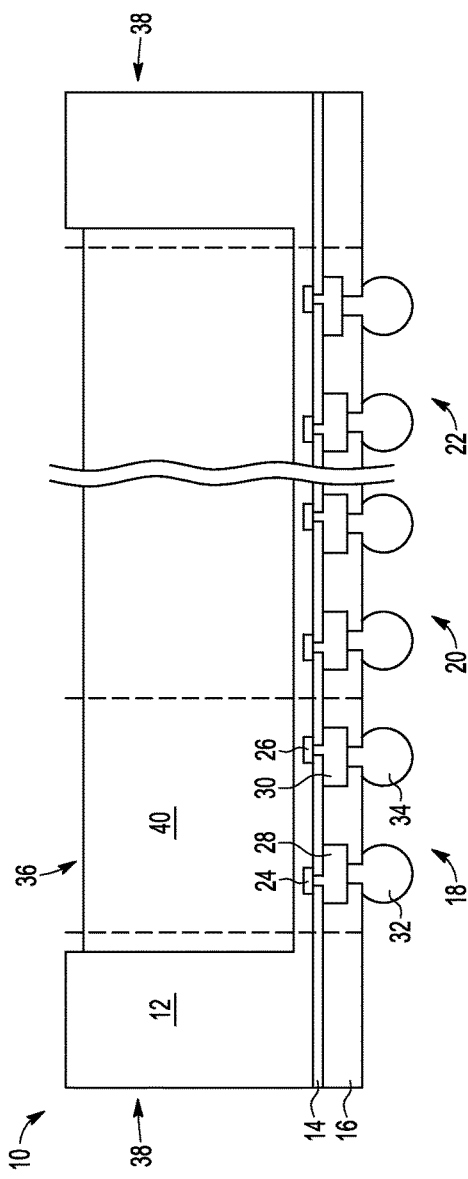

A wafer includes a plurality of semiconductor die, in which each die has a plurality of interconnects on an active surface (corresponding to the top surface) of the die. The wafer is prepared for chip scale packaging by grinding a backside of the wafer (opposite the active surfaces) to result in an inner portion and a rim portion at the periphery of the wafer, in which the rim portion is thicker than the inner portion and surrounds the plurality of semiconductor die. An encapsulant is formed over the inner portion, contained within the rim. After formation of the encapsulant, the plurality of semiconductor die are singulated, in which each singulated die includes an encapsulant material on the backside of the die, opposite the active surface. This encapsulant material allows the singulated die to be a composite structure which is less prone to breakage during testing or board mounting. In one embodiment, prior to singulation, grooves are formed in the backside encapsulant aligned with scribe lines to aid in singulation. In one embodiment, prior to singulation, openings are formed in the active side of the wafer along scribe lines, and a second encapsulant is formed on the active side of the wafer and within the openings to further improve the singulated die robustness.

FIG. 1 illustrates, in cross sectional form, a semiconductor structure 10 at a stage in processing, in accordance with one embodiment of the present invention. Structure 10 includes a semiconductor wafer 12 having a plurality of semiconductor die, such as die 18, 20, and 22. Each die includes a plurality of bond pads at an active surface of the die, such as bond pads 24 and 26 of die 18. Structure 10 includes a first passivation layer 14 over the active surface of each die (over the active surface of the wafer) with openings to expose the bond pads. Each die also includes rerouting metal, such as rerouting metal portions 28 and 30, over passivation layer 14 and within the openings in passivation layer 14 to contact the rerouting metal. Structure 10 includes a second passivation layer over the first passivation layer within openings to expose the rerouting metal portions. Each die includes interconnects, such as interconnects 32 and 34, which provide electrical contacts to the rerouting metal portions. For each die, the rerouting metal portions route signals between the bond pads and interconnects of the die, and thus allow a fan-in or fan-out re-routing of die pads to the interconnects such as interconnects 32 and 34. The interconnects of FIG. 1 are illustrated as solder bumps, but may be other types of interconnects such as solder balls, conductive pillars, or the like. Wafer 12 can be any semiconductor material or combinations of materials, such as gallium arsenide, silicon germanium, silicon-on-insulator (SOI), silicon, monocrystalline silicon, the like, and combinations of the above.

Note that the active surface of wafer 12 corresponds to the surface in contact with passivation layer 14, and the top of wafer 12 as illustrated in FIG. 1 corresponds to the backside of wafer 12, opposite the active surface of wafer 12. The dotted lines in FIG. 1 correspond to the scribe lines of wafer 12. The scribe lines (also referred to as a scribe grid) define the bounds of each die. The illustrated scribe lines run perpendicular to the page, and other scribe lines (not visible in the view of FIG. 1) run parallel to the page. Singulation, as will be described below, occurs along the scribe lines.

FIG. 2 illustrates, in cross-sectional form, semiconductor structure 10 at a subsequent stage in processing. A backside grind is performed to form an opening 36 in the backside of wafer 12 and a rim 38 at the perimeter of wafer 12, surrounding the plurality of semiconductor die. That is, rim 38 is around a perimeter of a major surface of wafer 12. The backside grind results in an inner portion having an inner planar surface surrounded by rim 38. Rim 38 extends higher than the inner planar surface. That is, rim 38 is thicker than the inner portion which includes the plurality of semiconductor die, and includes semiconductor material remaining after grinding. In one embodiment, a thickness of the inner portion, and thus each die, is in range of 10 to 50 microns.

FIG. 3 illustrates, in cross-sectional form, semiconductor structure 10 at a subsequent stage in processing. After the backside grind, an encapsulant 40 is formed on the inner planar surface, over the inner portion, and contained by rim 38. Therefore, encapsulant 40 is in contact with the backside of each die, opposite the active surface of each die. In one embodiment, encapsulant 40 is a liquid that is dispensed onto the inner planar surface. In an alternate embodiment, encapsulant 40 is a sheet encapsulant that is pressed onto the inner planar surface, within rim 38. Encapsulant 40 be coplanar with a top surface of rim 38, or may be lower than a top surface of rim 38, as illustrated in FIG. 3.

Figure 4:
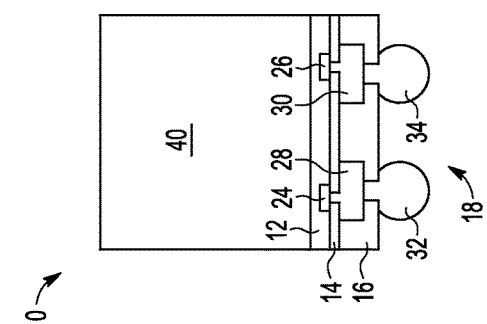

FIG. 4 illustrates, in cross-sectional form, semiconductor structure 10 at a subsequent stage in processing. After formation of encapsulant 40, wafer 12 is singulated along the scribe lines, resulting in, for example, singulated die 18. The singulation can be performed using a saw or laser. Note that each singulated die, such as singulated die 18, includes an encapsulant attached to the backside of the die, opposite the active surface. The encapsulant allows the singulated die to be a composite structure which is less brittle as compared to a singulated die that has only the semiconductor material of wafer 12 at its backside, without encapsulant 40. Therefore, a singulated die, such as singulated die 18, may experience less breakage during subsequent processing, such as testing or mounting to a printed circuit board (PCB).

FIG. 5 illustrates, in cross-sectional form, a semiconductor structure 56 in which like numerals with semiconductor structure 10 indicate like elements. In FIG. 5, rather than forming encapsulant 40 on the inner planar surface of the inner portion, an encapsulant 52 is formed on the inner planar surface of the inner portion. Encapsulant 52 includes grooves formed along the scribe lines of wafer 12, such as grooves 42, 44, 46, 48, and 50. These grooves are aligned to scribe lines that are perpendicular to the page. However, grooves are also aligned with the scribe lines that are parallel to the page. These grooves are aligned with the perimeters of the semiconductor die. These grooves extend into encapsulant 52 from a top surface of encapsulant 52, but do not extend all the way to the scribe lines of wafer 12 and thus do not expose a backside of each die. These grooves aid in singulation by thinning the encapsulant along the scribe lines. In one embodiment, a saw can be used to form the grooves. The saw may be coarser or thicker than the saw used for subsequent singulation. In another embodiment, the tool in which the encapsulant is formed may have protruding portions with correspond to grooves 42, 44, 46, 48, and 50 such that the liquid encapsulant surrounds the protrusions, resulting in the grooves upon removal from the tool.

FIG. 6 illustrates, in cross-sectional form, semiconductor structure 56 after singulation along the scribe lines resulting in singulated die, such as singulated die 18. Note that encapsulant 52 on singulated die 18 is tapered as compared to the encapsulant 40 on singulated die 18. The singulation can be performed using a saw or laser.

Figure 7:
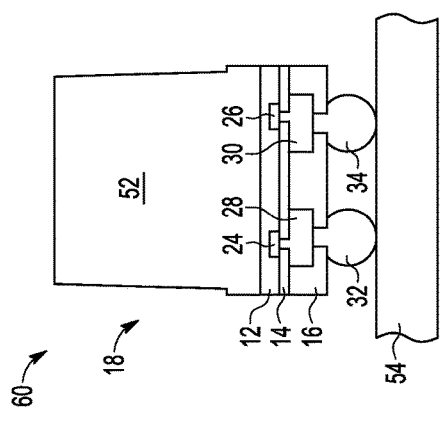

FIG. 7 illustrates, in cross-sectional form, singulated die 18 of semiconductor structure 56 attached to a PCB 54 to result in a mounted semiconductor die 60. The interconnects of die 18, such as interconnects 32 and 34, are connects to contacts of PCB 54. Note that singulated die 18 of semiconductor structure 10 of FIG. 4 can also be attached to a PCB, and the same discussion regarding coefficient of thermal expansion (CTE) applies. Typically, the coefficient of thermal expansion of a PCB is much higher that of the semiconductor die. For example, the PCB may have a CTE of 17 ppm/C while the die may have a CTE of about 3 ppm/C. This mismatch can cause poor solder joint reliability. The addition of an encapsulant, such as encapsulant 40 or 52, increases the CTE of the composite structure of the singulated die. For example, the CTE of the encapsulant may be in a range of 20 to 30 ppm/C, and the effective CTE of the composite structure is determined by the characteristics (such as thickness) of the encapsulant. Therefore, the CTE of the composite structure (e.g. the combination of the encapsulant and the die) may be designed to match the CTE of the PCB. In this manner, improved solder joint reliability when attached to a PCB can be achieved.

Figure 8:
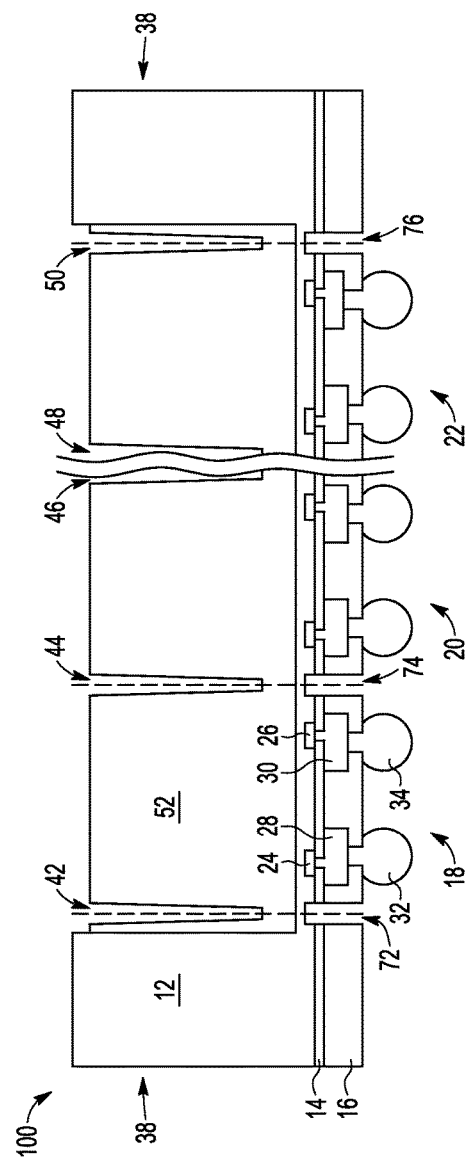
FIGS. 8-10 illustrate a semiconductor structure at various stages in processing, in accordance with one embodiment of the present invention.

FIG. 8 illustrates, in cross-sectional form, a semiconductor structure 100 in which like numerals with semiconductor structure 56 indicate like elements. In FIG. 8, after formation of encapsulant 52, openings are formed along the scribe lines in the active surface of wafer 12, such as openings 72, 74, and 76. In the illustrated embodiment, these openings do not extend all the way to encapsulant 52. However, in an alternate embodiment, these openings can extend to encapsulant 52 and expose encapsulant 52. This is possible because encapsulant 52 holds the die of wafer 12 in place during formation of the openings. Note, these openings can also be formed in the case of encapsulant 40.

Figure 9:
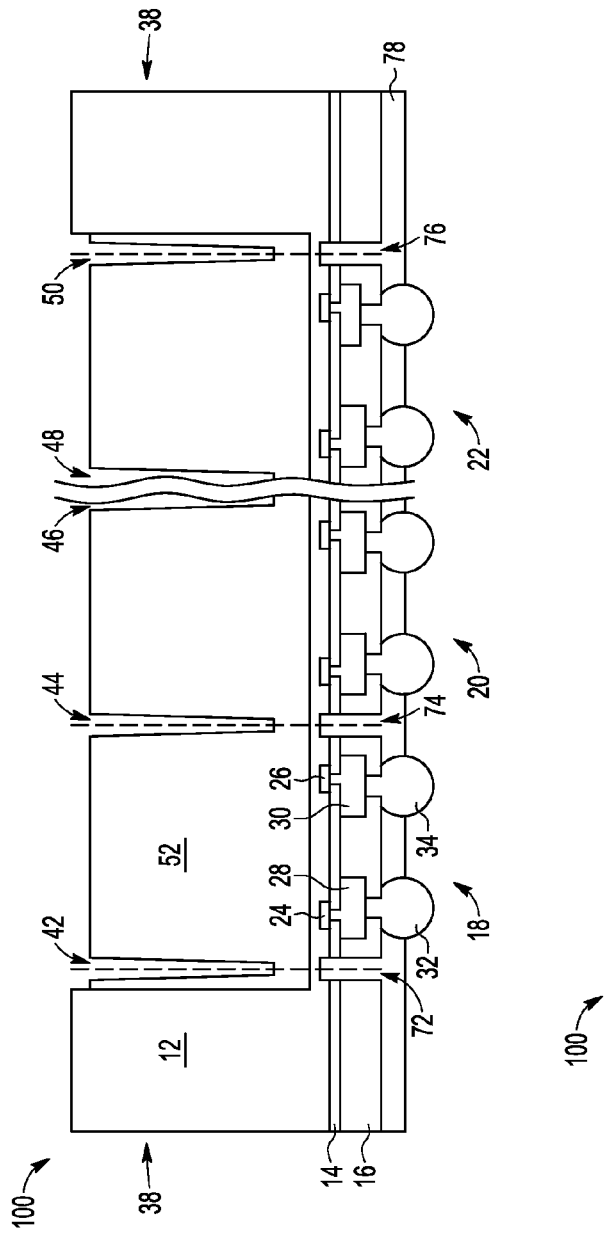

FIG. 9 illustrates, in cross-sectional form, semiconductor structure 100 at a subsequent stage in processing. After formation of the openings along the scribe lines, such as openings 72, 74, and 76, a second encapsulant 78 is formed over passivation layer 16 and interconnects 32 and 34. In one embodiment, film assisted molding is used to form encapsulant 78. Encapsulant 78 fills the openings in the active surface of wafer 12. This allows for an encapsulant to be formed both on the backside and front side of wafer 12.

Figure 10:
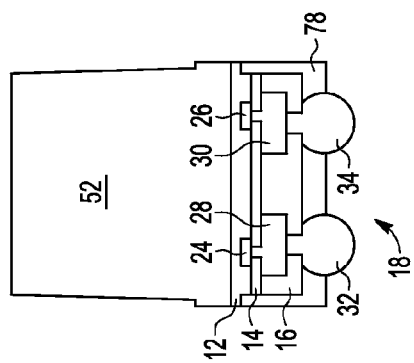

FIG. 10 illustrates, in cross-sectional form, semiconductor structure 100 after singulation along the scribe lines resulting in singulated die, such as singulated die 18. Note that, in this embodiment, the first encapsulant (such as encapsulant 52 or 40) is located on the backside of the die and the second encapsulant (encapsulant 78) is located on the front side and periphery sidewalls of the die. In this manner, the periphery sidewalls of the die are protected, such as from moisture or other contaminants.

Therefore, by now it should be appreciated how a back grinded wafer resulting in an inner portion and a rim surrounding the inner portion can allow for improved CSP. By applying an encapsulant over the inner portion, contained by the rim, reduced brittleness can be achieved in the resulting composite structure of the singulated device. That is, wafer 12 may have a first brittleness, but the encapsulant (encapsulant 40 or 52) has a second brittleness, less than the first brittleness. Wafer 12 with the encapsulant also has a brittleness less than the first brittleness. Therefore, the wafer with the encapsulant may be referred to as a composite structure wafer, and each die may be referred to as a composite structure die. Also note that due to the effects on CTE, each die may be referred as a CTE-compensated die.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention has been described with respect to specific conductivity types or polarity of potentials, skilled artisans appreciated that conductivity types and polarities of potentials may be reversed.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

The following are various embodiments of the present invention.

In one embodiment, a method of processing a semiconductor wafer includes forming a plurality of die in the semiconductor wafer, wherein the semiconductor wafer has a first brittleness; grinding a top surface the semiconductor wafer to leave an inner planar surface and a rim, wherein the rim extends above the inner planar surface and around a perimeter of the grinded semiconductor wafer; forming a first encapsulant material over the inner planar surface and contained within the rim to form a composite structure semiconductor wafer having a second brittleness less than the first brittleness; and performing singulation of the composite structure semiconductor wafer into the plurality of die in which each die of the plurality of die is a composite structure die. In one aspect, the performing singulation occurs along scribe lines defining bounds of the composite structure die. In a further aspect, the method further includes replacing at least portions of the semiconductor wafer in the scribe lines with a second encapsulant material. In another aspect, the rim includes semiconductor material remaining after grinding. In another aspect, the forming the first encapsulant material is further characterized by forming grooves in the supporting layer in which the grooves are aligned with perimeters of the semiconductor die of the semiconductor wafer. In a further aspect, the grooves reduce the encapsulant thickness along the scribe line for ease of singulation. In another aspect, the forming a plurality of die in the semiconductor wafer is further characterized by the semiconductor wafer having a first coefficient of thermal expansion (CTE); the forming the first encapsulant material results in the composite structure semiconductor wafer being further characterized as a CTE-compensated semiconductor wafer in which the CTE-compensated wafer has a second CTE higher than the first CTE; and the performing singulation results in each of the composite structure die being further characterized as a CTE-compensated die. In a further aspect, the method further includes mounting a first CTE-compensated die of the plurality of CTE-compensated die on a printed circuit board, wherein the printed circuit board has a CTE that is about the same as the second CTE. In yet a further aspect, the first encapsulant material is selected to have a thickness and a CTE that, combined with the semiconductor die, results in the second CTE being about the same as the CTE of the printed circuit board. In another aspect, the method further includes attaching solder balls to a side of the composite structure semiconductor wafer opposite the encapsulant.

In another embodiment, a semiconductor device structure includes a semiconductor wafer having a plurality of semiconductor die separated by a scribe grid and a rim of semiconductor material around a perimeter of a major surface of the semiconductor wafer in which the rim extends above the major surface, wherein the semiconductor wafer has a first brittleness; and a first encapsulant above the major surface and contained within the rim, wherein the first encapsulant has a second brittleness, wherein the first brittleness is more than the second brittleness. In one aspect, the scribe grid include a second encapsulant. In a further aspect, a portion of the scribe grid includes semiconductor material. In another aspect, the semiconductor material has a first coefficient of thermal expansion (CTE) and the first encapsulant has a second CTE, wherein the first CTE is less than the second CTE. In a further aspect, the semiconductor structure has a resulting third CTE that is about the same as a CTE of a printed circuit board. In another aspect, the first encapsulant has grooves aligned with the scribe grid. In a further aspect, the grooves extend less than all of the way to the scribe grid. In another aspect, the method further includes solder balls coupled to the semiconductor wafer on a side of the semiconductor wafer away from the first encapsulant.

In yet another embodiment, a method of obtaining a semiconductor wafer that is compensated for thermal expansion and brittleness includes grinding a surface of the semiconductor wafer to leave a surface and a rim extending above the surface and extending around a perimeter of the semiconductor wafer; and applying an encapsulant to the surface, wherein the encapsulant is contained within the perimeter by the rim during application of the encapsulant, and wherein the encapsulant provides compensation for high brittleness and low thermal expansion of the semiconductor wafer. In one aspect, the method further includes forming encapsulant regions in scribe grids in the semiconductor wafer that define borders of semiconductor die in the semiconductor wafer.

What is claimed is:
1. A method of processing a semiconductor wafer, comprising:
    forming the semiconductor wafer having a plurality of die formed in the semiconductor wafer, wherein the semiconductor wafer has a first brittleness, and wherein the semiconductor wafer has a top surface and a bottom surface, opposite the top surface;
    grinding the top surface of the semiconductor wafer to leave an inner planar surface and a rim, wherein the rim extends above the inner planar surface and around a perimeter of the grinded semiconductor wafer;
    forming a first encapsulant material over the inner planar surface and contained within the rim to form a composite structure semiconductor wafer, wherein the composite structure semiconductor wafer has a second brittleness less than the first brittleness, and wherein the first encapsulant material is formed as a single material directly on the inner planar surface such that the single material completely fills the rim and is coplanar with a top surface of the rim;
    performing singulation of the composite structure semiconductor wafer into the plurality of die in which each die of the plurality of die is a composite structure die, wherein the singulation is performed along scribe lines;

prior to performing singulation, forming a passivation layer on the bottom surface of the wafer and replacing at least portions of the semiconductor wafer in the scribe lines with a second encapsulant material, wherein the second encapsulant material is also formed on the passivation layer such that the passivation layer is between the first encapsulant material and the second encapsulant material.

2. The method of claim 1, wherein the rim comprises semiconductor material remaining after grinding.

3. The method of claim 1, wherein the forming the first encapsulant material is further characterized by forming grooves in the first encapsulant material in which the grooves are formed directly over the scribe lines.

4. The method of claim 3, wherein the grooves reduce the first encapsulant thickness along the scribe line for ease of singulation.

5. The method of claim 1, wherein:
the forming a plurality of die in the semiconductor wafer is further characterized by the semiconductor wafer having a first coefficient of thermal expansion (CTE);
the forming the first encapsulant material results in the composite structure semiconductor wafer being further characterized as a CTE-compensated semiconductor wafer in which the CTE-compensated wafer has a second CTE higher than the first CTE; and
the performing singulation results in each of the composite structure die being further characterized as a CTE-compensated die.

6. The method of claim 5, further comprising mounting a first CTE-compensated die of the plurality of CTE-compensated die on a printed circuit board, wherein the printed circuit board has a CTE that is the same as the second CTE.

7. The method of claim 6, wherein the first encapsulant material is selected to have a thickness and a CTE that, combined with the semiconductor die, results in the second CTE being the same as the CTE of the printed circuit board.

8. The method of claim 1, further comprising attaching solder balls to a side of the composite structure semiconductor wafer opposite the first encapsulant.

9. The method of claim 1, wherein forming the first encapsulant material comprises dispensing a liquid directly onto the inner planar surface such that the liquid reaches a top surface of the rim.

10. A semiconductor structure, comprising:
a semiconductor wafer having a plurality of semiconductor die formed in the semiconductor wafer separated by a scribe grid and a rim of semiconductor material around a perimeter of a major surface of the semiconductor wafer in which the rim extends above the major surface, wherein the semiconductor wafer has a first brittleness; and
a first encapsulant above the major surface and contained within the rim, wherein the first encapsulant has a second brittleness, wherein the first brittleness is more than the second brittleness, and wherein the first encapsulant comprises grooves formed directly over the scribe lines;
a passivation layer on a second major surface of the semiconductor wafer opposite the first major surface of the semiconductor wafer;
openings formed along the scribe lines in the second major surface of the semiconductor wafer which extend through the passivation layer; and
a second encapsulant in the openings and extending over the passivation layer on the second major surface such that the passivation layer is between the first encapsulant and the second encapsulant.

11. The semiconductor structure of claim 10, wherein a portion of the scribe grid comprises semiconductor material.

12. The semiconductor structure of claim 10, wherein the semiconductor material has a first coefficient of thermal expansion (CTE) and the first encapsulant has a second CTE, wherein the first CTE is less than the second CTE.

13. The semiconductor structure of claim 12, wherein the semiconductor structure has a resulting third CTE that is the same as a CTE of a printed circuit board.

14. The semiconductor structure of claim 10, wherein the openings extend through the passivation layer and into the first encapsulant, opposite the grooves.

15. The semiconductor structure of claim 10, further comprising solder balls coupled to the semiconductor wafer on a side of the semiconductor wafer away from the first encapsulant.

16. The semiconductor structure of claim 10, wherein the first encapsulant is directly on the major surface and completely fills the rim such that the first encapsulant is coplanar with a top surface of the rim.

17. A method of obtaining a semiconductor wafer that is compensated for thermal expansion and brittleness, comprising:
forming the semiconductor wafer having a plurality of die formed in the semiconductor wafer, wherein the semiconductor wafer has a back surface and a front surface, opposite the back surface;
grinding the back surface of the semiconductor wafer to leave a surface and a rim extending above the surface and extending around a perimeter of the semiconductor wafer;
applying an encapsulant to the surface, wherein the encapsulant is contained within the perimeter by the rim during application of the encapsulant, and wherein the encapsulant provides compensation for high brittleness and low thermal expansion of the semiconductor wafer, wherein the encapsulant is a sheet encapsulant that is pressed onto the surface within the rim; and
forming a passivation layer on the front surface of the semiconductor wafer; and
forming a second encapsulant in scribe grid regions in the semiconductor wafer at the front surface of the semiconductor wafer that define borders of semiconductor die in the semiconductor wafer, wherein the second encapsulant also extends onto the passivation layer such that the passivation layer is between the encapsulant and second encapsulant.

* * * * *